United States Patent
Fang et al.

(10) Patent No.: US 9,955,572 B2
(45) Date of Patent: *Apr. 24, 2018

(54) POLYIMIDE POLYMER, POLYIMIDE FILM, AND FLEXIBLE COPPER-COATED LAMINATE

(71) Applicant: TAIFLEX Scientific Co., Ltd., Kaohsiung (TW)

(72) Inventors: Yi-Kai Fang, Kaohsiung (TW); Tsung-Tai Hung, Kaohsiung (TW); Chiao-Pei Chen, Kaohsiung (TW); Chiu-Feng Chen, Kaohsiung (TW); Ching-Hung Huang, Kaohsiung (TW)

(73) Assignee: TAIFLEX Scientific Co., Ltd., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/296,055

(22) Filed: Oct. 18, 2016

(65) Prior Publication Data
US 2017/0034910 A1  Feb. 2, 2017

Related U.S. Application Data

(63) Continuation of application No. 14/565,420, filed on Dec. 10, 2014, now Pat. No. 9,505,887.

(30) Foreign Application Priority Data

Oct. 28, 2014  (TW) ............................. 103137208 A

(51) Int. Cl.
| | | |
|---|---|---|
| *H05K 1/03* | (2006.01) | |
| *C08G 73/10* | (2006.01) | |
| *C09D 179/08* | (2006.01) | |
| *H05K 1/02* | (2006.01) | |
| *H05K 1/09* | (2006.01) | |

(52) U.S. Cl.
CPC ......... *H05K 1/0313* (2013.01); *C08G 73/105* (2013.01); *C08G 73/1028* (2013.01); *C08G 73/1042* (2013.01); *C08G 73/1078* (2013.01); *C09D 179/08* (2013.01); *H05K 1/028* (2013.01); *H05K 1/0346* (2013.01); *H05K 1/09* (2013.01); *H05K 2201/0154* (2013.01); *H05K 2201/068* (2013.01)

(58) Field of Classification Search
CPC ....................................................... H05K 1/03
USPC ....................................................... 428/458
See application file for complete search history.

(56) References Cited

U.S. PATENT DOCUMENTS

2011/0155235 A1* 6/2011 Tseng ................. C08G 73/1039
  136/256
2012/0160317 A1* 6/2012 Leu .................... C08G 73/1042
  136/256

* cited by examiner

*Primary Examiner* — Doris L Lee
(74) *Attorney, Agent, or Firm* — JCIPRNET

(57) ABSTRACT

A polyimide polymer represented by the following formula 1 is provided.

formula 1

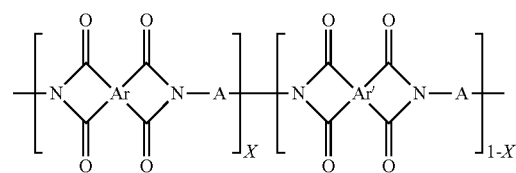

In formula 1, Ar is

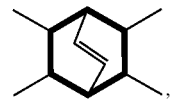

Ar' is

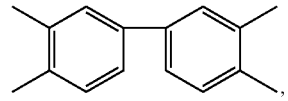

A is

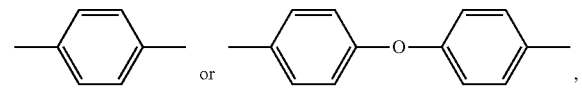

and 0<X<0.38.

8 Claims, No Drawings

POLYIMIDE POLYMER, POLYIMIDE FILM, AND FLEXIBLE COPPER-COATED LAMINATE

CROSS-REFERENCE TO RELATED APPLICATION

This is a continuation application of and claims the priority benefit of the prior patent application Ser. No. 14/565,420, filed on Dec. 10, 2014, now allowed, which claims the priority benefit of Taiwan application serial no. 103137208, filed on Oct. 28, 2014. The entirety of each of the above-mentioned patent applications is hereby incorporated by reference herein and made a part of this specification.

BACKGROUND OF THE INVENTION

Field of the Invention

The invention relates to a polyimide polymer, a polyimide film, and a flexible copper-coated laminate. More particularly, the invention relates to a polyimide polymer having a low dielectric constant, a polyimide film including the polyimide polymer, and a flexible copper-coated laminate including the polyimide film.

Description of Related Art

As electronic devices gradually become thinner and lighter, the demand for use of a flexible printed circuit board greatly increases. The mainly upstream material of the flexible printed circuit board is a flexible copper-coated laminate which is produced by coating or attaching a polyimide polymer onto a copper foil. In the current industry environment, the polyimide polymer is required to have a low dielectric constant, high thermal stability, and a coefficient of thermal expansion close to that of the copper foil. However, in the related art, through introducing fluorine-contained functional group into the polyimide polymer or introducing adamantane into the aliphatic polyimide polymer, the polyimide polymer can have a reduced dielectric constant but cannot have improved thermal stability and a proper coefficient of thermal expansion. Therefore, developing a polyimide polymer having a low dielectric constant, high thermal stability, and a coefficient of thermal expansion close to that of the copper foil is one of the desired goals to those skilled in the art.

SUMMARY OF THE INVENTION

The invention provides a polyimide polymer, and a polyimide film including the polyimide polymer can have a low dielectric constant, high thermal stability, and a coefficient of thermal expansion close to that of a copper foil. Besides, the polyimide film is suitable for being applied to a flexible copper-coated laminate.

In an embodiment of the invention, a polyimide polymer is represented by formula (1) as described below:

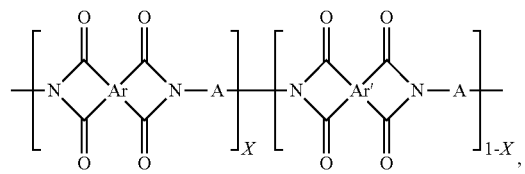

formula (1)

wherein Ar is

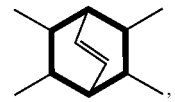

Ar' is

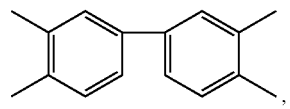

A is

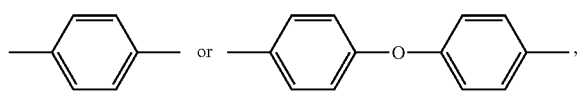

and 0<X<0.38.

According to an embodiment of the invention, a molar ratio of

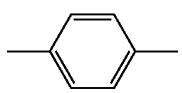

to

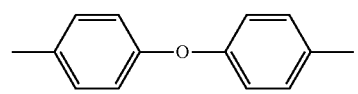

is 3:1 to 20:1.

In an embodiment of the invention, a polyimide film includes the polyimide polymer described above.

According to an embodiment of the invention, a dielectric constant of the polyimide film is 3 to 3.55, a coefficient of thermal expansion of the polyimide film is 12 ppm/° C. to 22 ppm/° C., and a glass transition temperature of the polyimide film is 350° C. to 365° C.

In an embodiment of the invention, a flexible copper-coated laminate includes a copper foil and the polyimide film described above. The polyimide film is disposed on the copper foil.

According to an embodiment of the invention, the flexible copper-coated laminate further includes an adhesive layer disposed between the copper foil and the polyimide film.

Based on the above, the polyimide polymer provided in the invention is produced by using two diamine monomers and two dianhydride monomers which have specific structures, and thereby the polyimide polymer and the polyimide film including the same can have a low dielectric constant, high thermal stability, and a coefficient of thermal expansion close to that of the copper foil.

To make the above features and advantages of the invention more comprehensible, several embodiments are described in detail as follows.

DESCRIPTION OF THE EMBODIMENTS

In the specification, a range represented by "a numerical value to another numerical value" is a schematic representation for avoiding listing all of the numerical values in the range in the specification. Therefore, the recitation of a specific numerical range covers each and every numerical value in the numerical range and each and every smaller numerical range defined by any numerical value in the numerical range, as is the case with each and every numerical value and each and every smaller numerical range stated expressly in the specification.

In the disclosure, skeleton formulas are sometimes used to represent radicals or compound structures. Such representation allows omission of carbon atoms, hydrogen atoms, and carbon-hydrogen bonds. Certainly, structural formulas with clear illustrations of atoms or atomic groups are definitive.

In order to prepare a polyimide polymer having a low dielectric constant, high thermal stability, and a coefficient of thermal expansion close to that of a copper foil, an embodiment of the invention provides a polyimide polymer capable of achieving said advantages, and embodiments are provided below as examples of actual implementation of the invention.

An embodiment of the invention provides a polyimide polymer represented by formula (1) as described below:

formula (1)

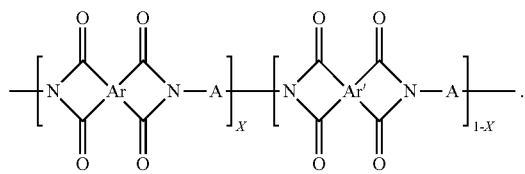

In the formula (1), Ar is

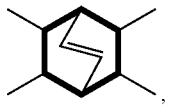

Ar' is

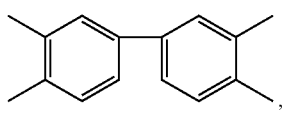

A is

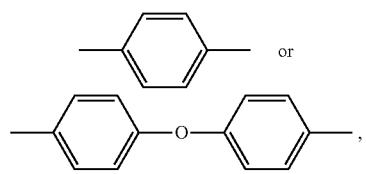

and 0<X<0.38. Moreover, in this embodiment, the molar ratio of

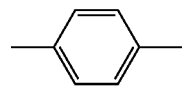

to

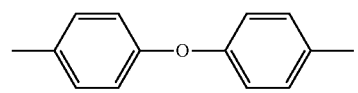

is 3:1 to 20:1.

In detail, Ar and Ar' are the residues of the different tetracarboxylic dianhydride compounds each excluding two carboxylic acid anhydride groups (—(CO)2O), and A is the residue of the diamine compound excluding two amino groups (—NH2). That is, in this embodiment, the polyimide polymer is obtained through the reaction of two different tetracarboxylic dianhydride compounds and two different diamine compounds. In the disclosure, the tetracarboxylic dianhydride compound which is used to produce the polyimide polymer is called the dianhydride monomer, and the diamine compound which is used to produce the polyimide polymer is called the diamine monomer.

Specifically, in this embodiment, the diamine monomers which are used to produce the polyimide polymer are p-phenylenediamine and 4,4'-diamino diphenyl ether, and the dianhydride monomers which are used to produce the polyimide polymer are bicyclo[2.2.2]oct-7-ene-2,3,5,6-tetracarboxylic dianhydride and 3,3',4,4'-biphenyl tetracarboxylic acid dianhydride. The method of producing the polyimide polymer includes following steps. First, in a water bath (at room temperature), p-phenylenediamine and 4,4'-diamino diphenyl ether are added into a solvent, mixed, and fully dissolved to form a diamine monomer mixture solution. In this step, based on the total mole number of p-phenylenediamine and 4,4'-diamino diphenyl ether, the mole percentage of p-phenylenediamine is, for instance, 76% to 95%, and the mole percentage of 4,4'-diamino diphenyl ether is, for instance, 5% to 24%. Moreover, in this step, the solvent is, for instance, a high-polarity solvent, such as hexamethylphosphoramide (HMPA), N,N-dimethylacetamide (DMAc), N-methyl-2-pyrrolidone (NMP), 1,3-dimethyl imidazolinone (DMI), or m-cresol.

Next, in a water bath (at room temperature), bicyclo[2.2.2]oct-7-ene-2,3,5,6-tetracarboxylic dianhydride and 3,3',4,4'-biphenyl tetracarboxylic acid dianhydride which are already premixed are added into the diamine monomer mixture solution for reaction, so as to form a polyamic acid solution. In this step, based on the total mole number of bicyclo[2.2.2]oct-7-ene-2,3,5,6-tetracarboxylic dianhydride and 3,3',4,4'-biphenyl tetracarboxylic acid dianhydride, the mole percentage of bicyclo[2.2.2]oct-7-ene-2,3,5,6-tetracarboxylic dianhydride is, for instance, greater than 0% and less than 38%, preferably 8% to 28%, and the mole percentage of 3,3',4,4'-biphenyl tetracarboxylic acid dianhydride is, for instance, 70% to 92%. Moreover, in this step, the reaction time is, for instance, 3 hours to 5 hours, and the solid content of the polyamic acid solution is, for instance, 15% to 20%.

Next, in a nitrogen-containing environment, the polyamic acid solution is subject to a dehydration reaction to form the polyimide polymer represented by formula 1. In detail, given that no catalyst is used, the dehydration reaction may include following steps. First, the polyamic acid solution is baked at 130° C. to 160° C. for 5 minutes to 10 minutes to remove the solvent, and the resultant is heated to 320° C. to 380° C. and then reacted for 20 minutes to 40 minutes. However, the invention is not limited thereto. In other embodiments, the dehydration reaction may also be carried out with a catalyst.

According to the present embodiment, by simultaneously using the aliphatic compound (bicyclo[2.2.2]oct-7-ene-2,3, 5,6-tetracarboxylic dianhydride belongs to aliphatic tetracarboxylic dianhydride) and the aromatic compounds (3,3', 4,4'-biphenyl tetracarboxylic acid dianhydride belongs to aromatic tetracarboxylic dianhydride, and p-phenylenediamine and 4,4'-diamino diphenyl ether belong to aromatic diamine) as monomers and keeping the usage amount of each monomer in the corresponding range mentioned above, the polyimide polymer produced thereby can be characterized by a low dielectric constant, high thermal stability, and a coefficient of thermal expansion close to that of the copper foil and can satisfy the industrial requirements.

Specifically, bicyclo[2.2.2]oct-7-ene-2,3,5,6-tetracarboxylic dianhydride is characterized by a low dielectric constant, and 3,3',4,4'-biphenyl tetracarboxylic acid dianhydride, p-phenylenediamine and 4,4'-diamino diphenyl ether are characterized by high thermal stability and high glass transition temperature. Moreover, when the mole percentage of each of 4,4'-diamino diphenyl ether and bicyclo[2.2.2] oct-7-ene-2,3,5,6-tetracarboxylic dianhydride is in the corresponding range mentioned above, the polyimide polymer may have a proper coefficient of thermal expansion and a low dielectric constant.

Moreover, because bicyclo[2.2.2]oct-7-ene-2,3,5,6-tetracarboxylic dianhydride is inexpensive, the use of bicyclo [2.2.2]oct-7-ene-2,3,5,6-tetracarboxylic dianhydride allows the polyimide polymer not only to satisfy the industrial requirement but also to have reduced manufacturing costs, and the resultant polyimide polymer can have the industrial value.

Moreover, as mentioned above, because the polyimide polymer is produced by simultaneously using the aliphatic compound and the aromatic compounds as monomers, the adhesion between a copper foil and the polyimide polymer containing a phenylene structure is favorable.

Moreover, based on the total mole number of p-phenylenediamine and 4,4'-diamino diphenyl ether, if the mole percentage of 4,4'-diamino diphenyl ether is greater than 24%, the coefficient of thermal expansion of the polyimide polymer may not be close to that of the copper foil. This is because the coefficient of thermal expansion of the polyimide polymer increases when the flexible chain (i.e. —O—) in the polyimide polymer increases. By contrast, based on the total mole number of p-phenylenediamine and 4,4'-diamino diphenyl ether, if the mole percentage of 4,4'-diamino diphenyl ether is less than 5%, the structure of the polyimide polymer may become more rigid, so that the film formed thereby may become hard and brittle and may not be conducive to molding and subsequent processing.

Moreover, based on the total mole number of bicyclo [2.2.2]oct-7-ene-2,3,5,6-tetracarboxylic dianhydride and 3,3',4,4-biphenyl tetracarboxylic acid dianhydride, if the mole percentage of bicyclo[2.2.2]oct-7-ene-2,3,5,6-tetracarboxylic dianhydride is equal to or greater than 38%, the viscosity of the polyimide polymer is reduced, so that the film forming ability of the polyimide polymer may not be satisfactory; as a result, the application value of the polyimide polymer in the industry may be reduced.

From another perspective, the polyimide polymer provided herein may be in form of a thin film, a powder, or a solution, and the polyimide polymer exemplified below is in form of the thin film.

Another embodiment of the invention provides a polyimide film including the above-mentioned polyimide polymer. In detail, the dielectric constant of the polyimide film is, for instance, 3 to 3.55, the coefficient of thermal expansion of the polyimide film is, for instance, 12 ppm/° C. to 22 ppm/° C., and the glass transition temperature of the polyimide film is, for instance, 350° C. to 365° C.

According to the above description of the method of producing the polyimide polymer, the method of producing the polyimide film includes following steps. First, after a polyamic acid solution is produced, the polyamic acid solution is coated onto a substrate by performing a coating process. Next, the polyamic acid solution is subject to a dehydration reaction. In detail, the coating process is, for instance, a blade coating process or a spin-on coating process, and the substrate is, for instance, a copper foil. Moreover, the dehydration reaction may include following steps. The polyamic acid solution is baked at 130° C. to 160° C. for 5 minutes to 10 minutes to remove the solvent, and the resultant is heated to 320° C. to 380° C. and then reacted for 20 minutes to 40 minutes. The thickness of the polyimide film is between about 12 μm to about 22 μm.

As mentioned above, because the polyimide polymer is characterized by a low dielectric constant, high thermal stability, a coefficient of thermal expansion close to that of the copper foil, favorable adhesion between the polyimide polymer and the copper foil, and low manufacturing costs, the polyimide film is also characterized by a low dielectric constant, high thermal stability, a coefficient of thermal expansion close to that of the copper foil, favorable adhesion between the polyimide film and the copper foil, and low manufacturing costs. As a result, the polyimide film not only satisfies the industrial requirement so as to be suitable for being applied to a flexible copper-coated laminate but also has the industrial value.

Another embodiment of the invention further provides a flexible copper-coated laminate including a copper foil and the above polyimide film, wherein the polyimide film serves as the flexible substrate of the flexible copper-coated laminate. Here, the copper foil may be any copper foil used in the flexible copper-coated laminate known to those having ordinary skill in the art. For example, the copper foil may be an electrolytic copper foil or a rolled copper foil, and the thickness thereof is not particularly limited herein.

According to the description of the method of producing the polyimide film above, the method of producing the flexible copper-coated laminate includes following steps. First, a polyamic acid solution is coated onto a copper foil by performing a coating process. Next, the polyamic acid solution is subject to a dehydration reaction so as to form a polyimide film on the copper foil.

Moreover, the flexible copper-coated laminate provided in an embodiment of the invention further includes an adhesive layer disposed between the copper foil and the polyimide film. The adhesive layer is applied, such that the copper foil is allowed to be tightly attached to the polyimide film. The material of the adhesive layer is, for instance, thermosetting resin.

As mentioned above, the polyimide film is characterized by a low dielectric constant, high thermal stability, and a coefficient of thermal expansion close to that of the copper foil and satisfies the industrial requirements, and the adhesion between the polyimide film and the copper foil is favorable, the flexible copper-coated laminate can be characterized by good process yield and reliability. Particularly, the polyimide film has a low dielectric constant, so that the electrical interference between circuits in the flexible substrate made of the flexible copper-coated laminate may be reduced, which is conductive to reduction of the parasitic capacitance and the resulting power load as well as reduction of signal delay and interference for preventing an increase in power consumption. Moreover, the polyimide film has the coefficient of thermal expansion close to that of the copper foil, so that the change to dimensions of the polyimide film, which arises from the high temperature process of producing the flexible copper-coated laminate, may be effectively inhibited. As a result, misalignment may be prevented, and the stability as to dimensional changes to the flexible copper-coated laminate can be enhanced. Moreover, the polyimide film has the low manufacturing costs; hence, the manufacturing costs of the flexible copper-coated laminate may be reduced, and the market competitiveness of the flexible copper-coated laminate may be increased.

The features of the invention are described in detail with reference to examples and a comparative example below. The following examples are explanatory, and the materials used, the amount of the materials, the ratio thereof, the processing details, and the processing procedures can be modified properly without exceeding the scope of the invention. Accordingly, the following examples should not serve to restrict the invention.

EXAMPLES

The main materials and the apparatus used in the preparation of the polyimide film provided in each of Examples 1-7 and Comparative Example 1 are provided below:

p-phenylenediamine: purchased from Tong Sing Chemicals Co., Ltd.;

4,4'-diamino diphenyl ether: purchased from JFE Chemical Corporation;

bicyclo[2.2.2]oct-7-ene-2,3,5,6-tetracarboxylic dianhydride: purchased from Tong Sing Chemicals Co., Ltd.;

3,3',4,4-biphenyl tetracarboxylic acid dianhydride: purchased from JFE Chemical Corporation;

N-Methyl-2-pyrrolidone: purchased from TEDIA Company Inc.;

copper foil: purchased from TOHCELLO Corporation;

litematic device: Litematic VL-50A made by Mitutoyo America Corporation.

Example 1

In a water bath (at room temperature), 12.92 g (0.119 mole, 95 mol %) of p-phenylenediamine (hereinafter PDA) and 1.26 g (0.006 mole, 5 mol %) of 4,4'-diamino diphenyl ether (hereinafter ODA) were dissolved in 200 g of N-Methyl-2-pyrrolidone used as a solvent to produce a diamine monomer mixture solution. After the dissolution is completed, in a water bath, 2.4985 g (0.01 mole, 8 mol %) of bicyclo[2.2.2]oct-7-ene-2,3,5,6-tetracarboxylic dianhydride (hereinafter BTA) and 33.319 g (0.113 mole, 92 mol %) of 3,3',4,4-biphenyl tetracarboxylic acid dianhydride (hereinafter BPDA) which had been already premixed were added into the diamine monomer mixture solution in three times and reacted in a water bath (at room temperature) for 3 hours, so as to obtain a polyamic acid solution whose solid content is 20%.

Next, 20 ml of the polyamic acid solution was coated onto a copper foil whose thickness is 18 μm by performing a blade coating process, and then the polyamic acid solution was baked at 150° C. for 10 minutes to remove the solvent. Then, the copper foil was subject to a dehydration reaction for 30 minutes at 350° C. in an oxygen-free environment to obtain a polyimide film provided in Example 1 and disposed on the copper foil. The copper foil was then removed by performing an etching process to obtain a polyimide film provided in Example 1, and the thickness of the polyimide film measured by the Litematic device is about 12 μm to 22 μm.

Examples 2-7

The polyimide film provided in each of Examples 2-7 was prepared through the same preparing process as the process for preparing the polyimide film provided in Example 1, while the mole percentage of each of monomers shown in Table 1 below was applied, respectively. Moreover, in Examples 2-7, the solid content of each of the polyamic acid solutions and the thickness of each of the polyimide films are shown in Table 1, respectively.

Comparative Example 1

The polyimide film provided in Comparative Example 1 was prepared through the same preparing process as the process for preparing the polyimide film provided in Example 1, while the mole percentage of each of monomers shown in Table 1 below was applied, respectively. Moreover, in Comparative Example 1, the solid content of the polyamic acid solution and the thickness of the polyimide film are shown in Table 1, respectively.

Subsequently, the dielectric constant, the coefficient of thermal expansion (CTE), the glass transition temperature, the thermal decomposition temperature, and the viscosity of the polyimide film in each of Examples 1-7 and Comparative Example 1 were measured, and the peeling strength of the polyimide film on the copper foil as provided in each of Examples 1-7 and Comparative Example 1 was measured. The above measurements are described below, and the results thereof are shown in Table 1.

<Measurement of Dielectric Constant>

First, the polyimide film provided in each of Examples 1-7 and the Comparative Example 1 was transformed into a film material whose length-width dimension was 7 cm×10 cm. After each of the film materials was baked at 130° C. for 2 hours in a baking oven, each of the film materials was placed in a dry box for one day. The dielectric constant of the polyimide film of each of Examples 1-7 and Comparative Example 1 was then measured by a dielectric constant analyzer (R&S®ZVB20V Vector Network Analyzer made by Rohde & Schwarz Corporation), wherein the measurement frequency is 10 GHz. In the industry, the dielectric constant of the polyimide film should be equal to or less than 3.5 in order to meet the product requirement, and the smaller the dielectric constant, the better the insulation property.

<Measurement of Coefficient of Thermal Expansion>

First, the polyimide film provided in each of Examples 1-7 and Comparative Example 1 was transformed into a film material whose length-width dimension was 2 mm×30 mm. Next, in a thermo-mechanical analyzer (EXSTAR 6000 made by Seiko Instrument Inc.), the temperature of each of the film materials was raised from 30° C. to 450° C. in a nitrogen-containing environment at a rate of 10° C./min. The average of changes to dimension of each of the film materials within the temperature range from 50° C. to 300° C. was determined, so as to obtain the coefficient of thermal expansion of the polyimide film provided in each of Examples 1-7 and Comparative Example 1. In general, the coefficient of thermal expansion of the copper foil is 17 ppm/° C., and a coefficient of thermal expansion being 17±5 ppm/° C. is deemed close to that of the copper foil.

<Measurement of Glass Transition Temperature>

First, the polyimide film provided in each of Examples 1-7 and Comparative Example 1 was transformed into a film material whose length-width dimension was 5 mm×40 mm. Next, in a dynamic mechanical analyzer (EXSTAR 6100 made by Seiko Instrument Inc.), the temperature of each of the film materials was raised from 30° C. to 450° C. in a nitrogen-containing environment at a rate of 10° C./min. Accordingly, the temperature at which the loss tangent (tanδ) reached a maximum value was considered the glass transition temperature of the polyimide film. In the industry, the standard glass transition temperature of the polyimide film is 300° C., and the greater the standard glass transition temperature, the better the thermal stability of the polyimide film.

<Measurement of Thermal Decomposition Temperature>

First, 0.5 g to 0.8 g of the polyimide film provided in each of Examples 1-7 and Comparative Example 1 was weighed, and the weighed polyimide film serves as a measurement film material. Next, in a thermo-gravimetric analyzer (EXSTAR 6000 made by Seiko Instrument Inc.), the temperature of each of the film materials was raised from 30° C. to 600° C. in a nitrogen-containing environment at a rate of 10° C./min. Accordingly, the temperature at which the weight loss of the film material is 5% was regarded as the thermal decomposition temperature of the polyimide film. In the industry, the thermal decomposition temperature of the polyimide film is generally at least equal to or greater than 450° C., and the greater the thermal decomposition temperature, the better the thermal stability of the polyimide film.

<Measurement of Viscosity>

First, 0.5 g of the polyimide film provided in each of Examples 1-7 and Comparative Example 1 was weighted, and the weighed polyimide film serves as a measurement film material. Next, the viscosity of each of the film materials was measured by a viscometer (DV-I made by Brookhaven Instruments Corp.), In Table 1, the smaller the viscosity, the worse the film forming ability.

<Measurement of Peeling Strength>

First, the polyimide film provided in each of Examples 1-7 and Comparative Example 1 and disposed on the copper foil was cut together with the copper foil into a measurement sample whose width is 0.3175 mm. Next, in a universal testing machine (AG-1S made by Shimadzu Corporation), each of the measurement samples was stretched to a length of 30 mm at a rate of 50.8 mm/min, and accordingly the peeling strength was determined. Note that the greater the adhesion between the polyimide film and the copper foil is, the more difficult the interface between the polyimide film and the copper foil is destroyed by an external force. That is, in Table 1, the greater the anti-peeling strength, the better the adhesion between the polyimide film and the copper foil. In the industry, the standard peeling strength should be at least greater than 1.0 kgf/cm.

TABLE 1

|  | Example 1 | Example 2 | Example 3 | Example 4 | Example 5 | Example 6 | Example 7 | Comparative Example 1 |
|---|---|---|---|---|---|---|---|---|
| PDA (mol %)* | 95 | 95 | 95 | 85 | 76 | 95 | 95 | 95 |
| ODA (mol %)* | 5 | 5 | 5 | 15 | 24 | 5 | 5 | 5 |
| BTA (mol %)** | 8 | 12 | 18 | 18 | 18 | 24 | 28 | 38 |
| BPD (mol %)** | 92 | 88 | 82 | 82 | 82 | 76 | 72 | 62 |
| solid content of polyamic acid solution (%) | 20 | 15 | 15 | 15 | 15 | 20 | 20 | 20 |
| thickness (μm) | 12~22 | 12~22 | 12~22 | 12~22 | 12~22 | 12~22 | 12~22 | — |
| dielectric constant | 3.51 | 3.38 | 3.33 | 3.53 | 3.34 | 3.4 | 3.54 | — |
| coefficient of thermal expansion (ppm/° C.) | 15.9 | 14.4 | 12.7 | 17.6 | 19.6 | 18.2 | 20.5 | — |
| glass transition temperature (° C.) | 365 | 364 | 354 | 360 | 360 | 358 | 365 | 386 |
| thermal decomposition temperature (° C.) | 585 | 544 | 514 | 501 | 492 | 488 | 469 | 454 |
| viscosity (cps) | 26000 | 16600 | 9200 | 1650 | 2500 | 13300 | 23400 | 5300 |
| peeling strength (kgf/cm) | 1.29 | 1.41 | 1.4 | 1.14 | 1.14 | 1.31 | 1.2 | — |

*unit of mol % is based on the total mole number of p-phenylenediamine and 4,4'-diamine diphenyl ether
**unit of mol % is based on the total mole number of bicyclo[2.2.2]oct-7-ene-2,3,5,6-tetracarboxylic dianhydride and 3,3',4,4-biphenyl tetracarboxylic acid dianhydride It can be known from Table 1 that the dielectric constant of the polyimide film provided in each of Examples 1-7 is between 3.33 and 3.54, indicating that the polyimide film provided in each of Examples 1-7 has a low dielectric constant and a favorable insulation property. Besides, it can be known from Table 1 that the glass transition temperature of the polyimide film provided in each of Examples 1-7 is between 354° C. and 365° C., and the thermal decomposition temperature of the polyimide film provided in each of Examples 1-7 is between 469° C. and 584° C., indicating that the polyimide film provided in each of Examples 1-7 has high thermal stability. Moreover, it can be known from Table 1 that the coefficient of thermal expansion of the polyimide film provided in each of Examples 1-7 is between 12.7 ppm/° C. and 20.5 ppm/° C., indicating that the coefficient of thermal expansion of the polyimide film provided in each of Examples 1-7 is close to that of the copper foil. It can also be known from Table 1 that, in Examples 1-7, the peeling strengths are all greater than 1.0 kgf/cm, indicating that the adhesion between the copper foil and the polyimide film provided in each of Examples 1-7 is satisfactory. Further, it can be known from Table 1 that the viscosity of the polyimide film provided in Example 4 is 1650 cps, and the viscosity of the polyimide film provided in Example 5 is 2500 cps. Owing to the large usage amount (15 mol % and 24 mol %) of 4,4'-diamino diphenyl ether, which is equipped with a flexible chain and ensures the flexibility of the polyimide film, the polyimide films provided in Example 4 and Example 5 still have the satisfactory film forming ability.

In contrast, the mole percentage of bicyclo[2.2.2]oct-7-ene-2,3,5,6-tetracarboxylic dianhydride of the polyimide film provided in Comparative Example 1 is 38%, and it can be concluded that the viscosity of the polyimide film is 5300 cps, and the film forming ability of the polyimide film is not satisfactory. Accordingly, the polyimide film provided in Comparative Example 1 is unfavorable for a production of a flexible copper-coated laminate, and the dielectric constant, the coefficient of thermal expansion, and the peeling strength of the polyimide film cannot be measured.

Although the invention has been described with reference to the above embodiments, it will be apparent to one of the ordinary skill in the art that modifications to the described embodiments may be made without departing from the spirit of the invention. Accordingly, the scope of the invention is defined by the attached claims not by the above detailed descriptions.

What is claimed is:

1. A polyimide polymer represented by formula (1) below:

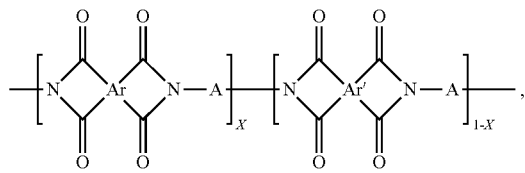

formula (1)

wherein Ar is

Ar' is

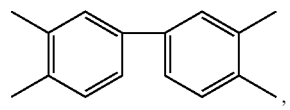

A comprises

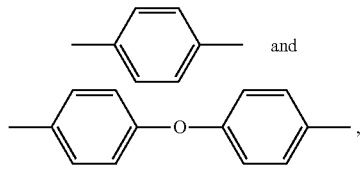

and $0<X<0.38$.

2. The polyimide polymer of claim 1, wherein a molar ratio of

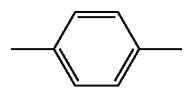

to

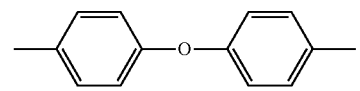

is 3:1 to 20:1.

3. A polyimide film comprising the polyimide polymer of claim 1.

4. The polyimide film of claim 3, wherein a dielectric constant of the polyimide film is 3 to 3.55.

5. The polyimide film of claim 3, wherein a coefficient of thermal expansion of the polyimide film is 12 ppm/° C. to 22 ppm/° C.

6. The polyimide film of claim 3, wherein a glass transition temperature of the polyimide film is 350° C. to 365° C.

7. A flexible copper-coated laminate comprising:
a copper foil; and
a polyimide film disposed on the copper foil, wherein the polyimide film is the polyimide film of claim 3.

8. The flexible copper-coated laminate of claim 7, further comprising an adhesive layer disposed between the copper foil and the polyimide film.

* * * * *